United States Patent
Lai et al.

(10) Patent No.: US 12,512,382 B2
(45) Date of Patent: Dec. 30, 2025

(54) SEMICONDUCTOR DEVICE INCLUDING STRESS CONTROL LAYER AND METHODS OF FORMING THE SAME

(71) Applicant: Taiwan Semiconductor Manufacturing Company Limited, Hsinchu (TW)

(72) Inventors: Chieh-Lung Lai, Taichung (TW); Meng-Liang Lin, Hsinchu (TW); Hsien-Wei Chen, Hsinchu (TW); Shin-Puu Jeng, Po-Shan Village (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 327 days.

(21) Appl. No.: 18/330,432

(22) Filed: Jun. 7, 2023

(65) Prior Publication Data
US 2024/0413034 A1  Dec. 12, 2024

(51) Int. Cl.
*H01L 23/31* (2006.01)
*H01L 21/56* (2006.01)
(Continued)

(52) U.S. Cl.
CPC ........ *H01L 23/3192* (2013.01); *H01L 21/568* (2013.01); *H01L 23/29* (2013.01);
(Continued)

(58) Field of Classification Search
CPC ... H01L 23/3192; H01L 23/29; H01L 23/291; H01L 23/298; H01L 23/3185; H01L 21/568; H01L 24/81; H01L 24/18; H01L 24/19; H01L 24/80; H01L 25/50; H01L 25/0657; H10B 80/00
See application file for complete search history.

(56) References Cited

U.S. PATENT DOCUMENTS 12,272,629 B2 *  4/2025  Liu .................... H01L 25/0652
2022/0399294 A1 * 12/2022  Dogiamis .......... H01L 25/0652
(Continued)

FOREIGN PATENT DOCUMENTS

TW          202312290 A      3/2023

OTHER PUBLICATIONS

TW Patent and Trademark Office; TW Application No. 112128727; 2nd Office Action mailed Jul. 9, 2025; 14 pages.

*Primary Examiner* — Alonzo Chambliss
(74) *Attorney, Agent, or Firm* — The Marbury Law Group, PLLC

(57) ABSTRACT

A semiconductor device includes a bottom die including a first semiconductor layer, and a first redistribution layer (RDL) disposed on a bottom surface of the first semiconductor layer; a top die disposed on a top surface of the first semiconductor layer and including a second semiconductor layer, and a second RDL disposed on the top surface of the first semiconductor layer; a stress control (SC) layer disposed on the top surface of the first semiconductor layer and side surfaces of the top die; and a dielectric layer disposed on the SC layer, wherein the SC layer is configured to apply a compressive stress of at least −100 MPa to the top surface of the first semiconductor layer, or the SC layer is configured to apply a tensile stress of at least 100 MPa to the top surface of the first semiconductor layer.

20 Claims, 8 Drawing Sheets

(51) Int. Cl.
  *H01L 23/00* (2006.01)
  *H01L 23/29* (2006.01)
  *H01L 25/00* (2006.01)
  *H01L 25/18* (2023.01)
  *H10B 80/00* (2023.01)

(52) U.S. Cl.
  CPC .......... *H01L 23/291* (2013.01); *H01L 23/298* (2013.01); *H01L 23/3185* (2013.01); *H01L 23/562* (2013.01); *H01L 24/19* (2013.01); *H01L 24/80* (2013.01); *H01L 24/81* (2013.01); *H01L 25/18* (2013.01); *H01L 25/50* (2013.01); *H10B 80/00* (2023.02); *H01L 24/08* (2013.01); *H01L 24/16* (2013.01); *H01L 24/32* (2013.01); *H01L 24/73* (2013.01); *H01L 2224/08145* (2013.01); *H01L 2224/16227* (2013.01); *H01L 2224/32225* (2013.01); *H01L 2224/73204* (2013.01); *H01L 2224/81815* (2013.01); *H01L 2924/20106* (2013.01); *H01L 2924/20107* (2013.01)

(56) References Cited

U.S. PATENT DOCUMENTS

2023/0137691 A1* 5/2023 Lai ..................... H01L 23/145
                                                              257/701
2024/0071999 A1* 2/2024 Lin ..................... H01L 24/25

* cited by examiner

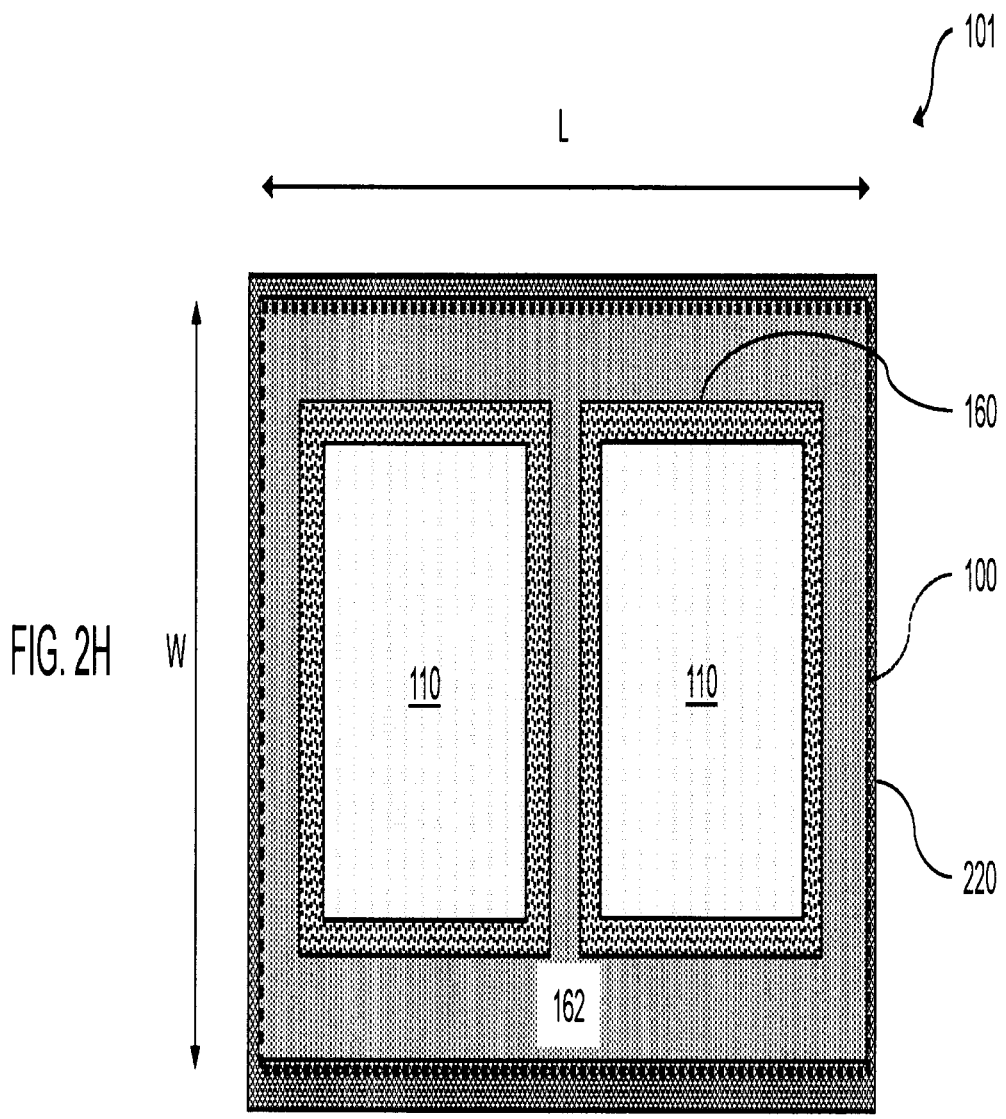

SEMICONDUCTOR DEVICE INCLUDING STRESS CONTROL LAYER AND METHODS OF FORMING THE SAME

BACKGROUND

The semiconductor industry has continually grown due to continuous improvements in integration density of various electronic components, e.g., transistors, diodes, resistors, capacitors, etc. For the most part, these improvements in integration density have come from successive reductions in minimum feature size, which allows more components to be integrated into a given area.

In addition to smaller electronic components, improvements to the packaging of components seek to provide smaller packages that occupy less area than previous packages. Examples of the type of packages for semiconductors include quad flat pack (QFP), pin grid array (PGA), ball grid array (BGA), flip chips (FC), three-dimensional integrated circuits (3DICs), wafer level packages (WLPs), package on package (PoP), System on Chip (SoC) or System on Integrated Circuit (SoIC) devices. Some of these 3D devices (e.g., 3DIC, SoC, SoIC) are prepared by placing chips over chips on a semiconductor wafer level. These three-dimensional devices provide improved integration density and other advantages, such as faster speeds and higher bandwidth, because of the decreased length of interconnects between the stacked chips. However, there are many challenges related to three-dimensional devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2H is a top view of a semiconductor device of FIG. 2G.

DETAILED DESCRIPTION

Figures 1A, 1B, 1C:
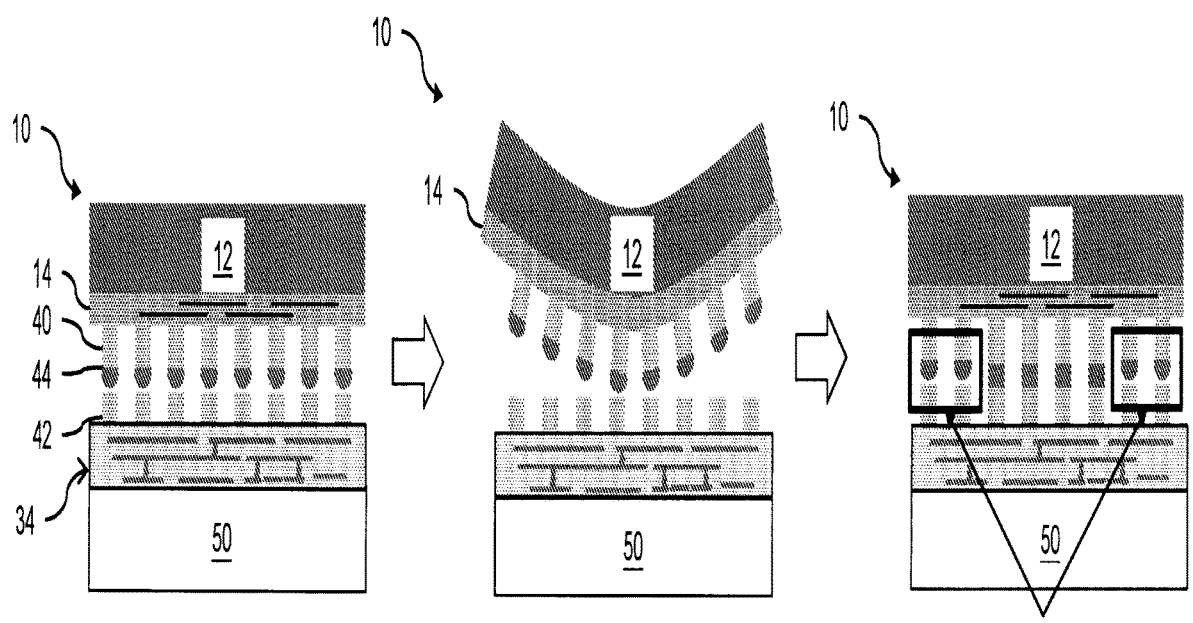
FIGS. 1A-1C are vertical cross-section views of a high-temperature bonding process, according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

Typically, in a semiconductor package, a number of semiconductor integrated circuit (IC) dies (i.e., "chips") may be mounted onto a common substrate, which may also be referred to as a "package substrate." In some package structures, such as in a fan out wafer level package (FOWLP) and/or fan-out panel level package (FOPLP), a plurality of semiconductor IC dies may be mounted to an interposer, such as an organic interposer or a semiconductor (e.g., silicon) interposer, that may include interconnect structures extending therethrough. The resulting package structure, including the interposer and the semiconductor IC dies mounted thereon, may then be mounted onto a surface of a package substrate using solder connections. An underfill layer may be provided in the space between the interposer and the package substrate to encapsulate the solder connections and improve the structural coupling between the interposer and the package substrate. Generally, the various embodiment methods and structures disclosed herein may be used to provide a chip package structure such as a FOWLP and FOPLP configurations. While the present disclosure is described using an FOWLP configuration, the methods and structures of the present disclosure may be implemented in an FOPLP configuration or any other package configuration.

Differences in materials used among the various components contained in a semiconductor package and/or device having different coefficients of thermal expansion (CTE) may result in high amounts of thermo-mechanical stress, which may result in the formation of cracks and/or dislocations. In addition, semiconductor dies and/or devices including thin and/or high aspect ratio semiconductor substrates may be more susceptible to warping due to residual stress applied by device layers formed thereon. Various embodiments disclosed herein form a semiconductor package with a stress control layer that may apply compressive or tensile stress to compensate for or mitigate against the counter tensile or compressive stress that is the result of residual stresses due to the formation of the devices in the semiconductor package. By including the stress control layer, the semiconductor package may maintain a relative planar configuration that allows for better bonding to interposers, RDL and/or substrates.

Residual stress may be defined as the existence of a state of stress in a material in the absence of any externally applied forces. The residual stress generated by a device layer may be affected by the process used for depositing the layer, the specific process parameters (e.g., chemistry, temperature, plasma power, etc.), the type of material deposited, the type of substrate the material is deposited onto, the thickness of the deposited layer, and/or CTE differences among adjacent layers. CTE differences in particular may result in high amounts of thermo-mechanical stress, which may result in the formation of cracks and/or dislocations.

Residual stresses may be separated into extrinsic residual stresses that result from exposure to an external environmental (e.g., temperature changes, chemical reactions, moisture absorption, etc.) and intrinsic residual stresses that result from the internal structural properties of a deposited film. Both types of residual stress may have an impact on the performance and reliability of the semiconductor package. Thus, it is desirable to understand and control residual stress during the design and manufacturing process.

Extrinsic residual stress in a semiconductor package may be caused by external factors, such as mechanical stress during assembly, packaging, and handling, thermal mismatch between the materials used in the package and mechanical forces induced by temperature changes during operation. Extrinsic residual stress commonly results from device layers formed of materials having different CTEs. CTE differences may exist between different material layers in a thin-film layer stack as well as between one or more deposited material layers and a substrate. These types of residual stresses may commonly be observed in thin-film material deposition processes performed at elevated temperatures, such as CVD processes.

For example, in instances in which a thin-film material layer having a different CTE is deposited at an elevated temperature onto a substrate, the different CTEs of the thin-film material layer and substrate may result in either the thin-film material layer or substrate contracting more than the other after the deposition is completed and the substrate and thin-film material layer are cooled to room temperature. Similarly, residual stress may be generated when a layered device structure is heated, such as during a bonding process, which may result in substrate warping. Such warping may reduce bonding efficiency by preventing proper alignment of bonding structures during a bonding process.

Intrinsic residual stress in a semiconductor package may be caused by internal factors such as stress generated during the solidification of the materials used in the package, the mismatch of the CTE between materials and the stress generated by the internal structures and components of the package. Intrinsic residual stress may be due to micro-scale and atomic-level structural imperfections. Micro-scale imperfections may include imperfections between the boundaries of grains and grain columns, voids between grains, and other similar micro-scale defects in the thin film. Atomic-level imperfections may include atomic point defects, lattice mismatches, dislocations, impurity incorporation, etc. All of these structural issues may result from imbalanced growth conditions and/or the incorporation of impurities into a growing thin-film layer. Atomic-level defects in the lattice structure from its equilibrium state and imperfections in the microstructure may both cause elastic deformations of the thin-film material layer thereby resulting in an intrinsic residual stress.

The thickness of the deposited layer may also have an impact on residual stress. For example, many thin-film material layers exhibit residual stress that is proportional to the thickness of the thin-film material layer. For example, a thin film may generate a slight compressive stress when deposited at a thickness of tens of Angstroms. As the thickness of the thin film increases to around 100 Angstroms, the thin film may generate a tensile stress. As the thickness of the thin film is increased to of several hundreds of Angstroms, the thin film may again generate a compressive stress.

As discussed above, there are a large number of factors that impact or contribute to the resultant value of the residual stress in a thin-film layer. As a practical matter, it is typically difficult to separate the causes as well as their relative contributions to the total residual stress in a thin film package. While relatively small amounts of residual stress may be disregarded in semiconductor device manufacturing, the various embodiments disclosed herein seek to mitigate the negative impacts on packages that use thinner and higher aspect ratio semiconductor substrates. For example, as discussed below, excessive residual stress may result in failed bonding due to die and/or semiconductor substrate warpage.

FIGS. 1A-1C are vertical cross-sectional views illustrating a die bonding process, according to various embodiments of the present disclosure. Referring to FIG. 1A, a pick and place process may be used to position a semiconductor die 10 over an interposer 34 disposed on a carrier 50. The semiconductor die 10 may include a semiconductor substrate 12, such as a silicon substrate, and a redistribution layer (RDL) 14 (e.g., interconnect structure) disposed on the semiconductor substrate 12. The semiconductor substrate 12 may be relatively thin (e.g., less than about 100 μm) and/or may have a relatively high aspect ratio. In some other embodiments, the semiconductor die 10 may include multiple chiplets integrated as one integrated die.

The RDL 14 may include first bonding structures 40, such as micro-bumps and/or bonding pads. The interposer 34 may include second bonding structures 42, such as micro-bumps and/or bonding pads. Solder balls 44 may be formed on the first bonding structures 40 as shown in FIG. 1A or may alternatively be formed on the second bonding structures 42.

The pick and place process may include positioning the semiconductor die 10 such that the first bonding structures 40 are aligned with the second bonding structures 42. The pick and place process may be performed at approximately room temperature (e.g., about 25° C.). As such, minimal residual stress may be applied to the semiconductor die 10 and thus, the semiconductor die 10 may be substantially planar. However, depending on the materials and/or manufacturing process used to form the RDL 14, in some embodiments residual stress applied to the semiconductor substrate 12 by the RDL 14 may result in die warpage, even at room temperature, and the warpage may increase at higher temperatures.

Referring to FIG. 1B, a high-temperature bonding process may be performed to reflow the solder balls 44 and join the semiconductor die 10 to the interposer 34. For example, the bonding process may be performed at temperatures ranging from 215° C. to about 275° C., for tin and or lead/tin solders. The high temperature may result in warpage of the semiconductor die 10, due to coefficient of thermal expansion (CTE) differences between the semiconductor substrate 12 and the RDL 14. As a result, the semiconductor die 10 may be non-planar, such that some of the first bonding structures 40 are pulled away from the second bonding structures 42. For example, the CTE of the RDL 14 may be higher than the CTE of the semiconductor substrate 12, which may result in increased residual stress-related warping of the semiconductor die 10, such that the top surface of the semiconductor die 10 is concave. In other words, the RDL 14 may generate compressive residual stress at the bottom surface of the semiconductor substrate 12.

As shown in FIG. 1C, after the bonding process is complete the semiconductor die 10 may return to a more planar configuration. However, the bonding process may fail in certain regions of the die 10, such as at edge regions of the semiconductor die 10 as shown in FIG. 1C. However, failed bonding may also occur in a central region of the semiconductor die 10, such as in instances in which tensile residual stress is applied to the bottom surface of the semiconductor substrate 12 and the top surface of the semiconductor die 10 becomes concave.

According to various embodiments, semiconductor devices and manufacturing methods may be provided that are configured to improve bonding efficiency by controlling warpage of a semiconductor substrate. For example, various embodiments may include components configured to counteract residual stress applied to a semiconductor substrate.

FIGS. 2A-2G are vertical cross-section views showing a method of manufacturing a semiconductor device, according to various embodiments of the present disclosure. FIG. 2H is a top view of a semiconductor device shown in FIG. 2G. FIG. 3 is a flow chart including operations of the method of FIGS. 2A-2G.

Figure 2A:
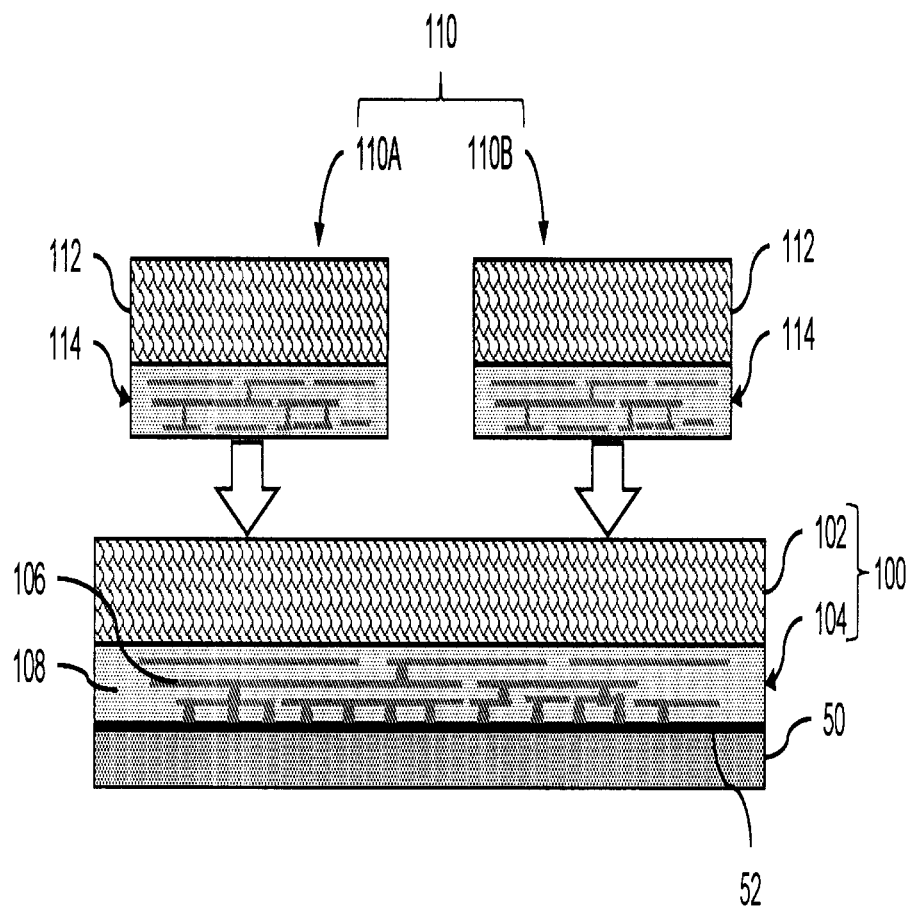
FIGS. 2A-2G are vertical cross-section views of various intermediate structures that are formed during a method of manufacturing a semiconductor device, according to various embodiments of the present disclosure.
Figure 3:
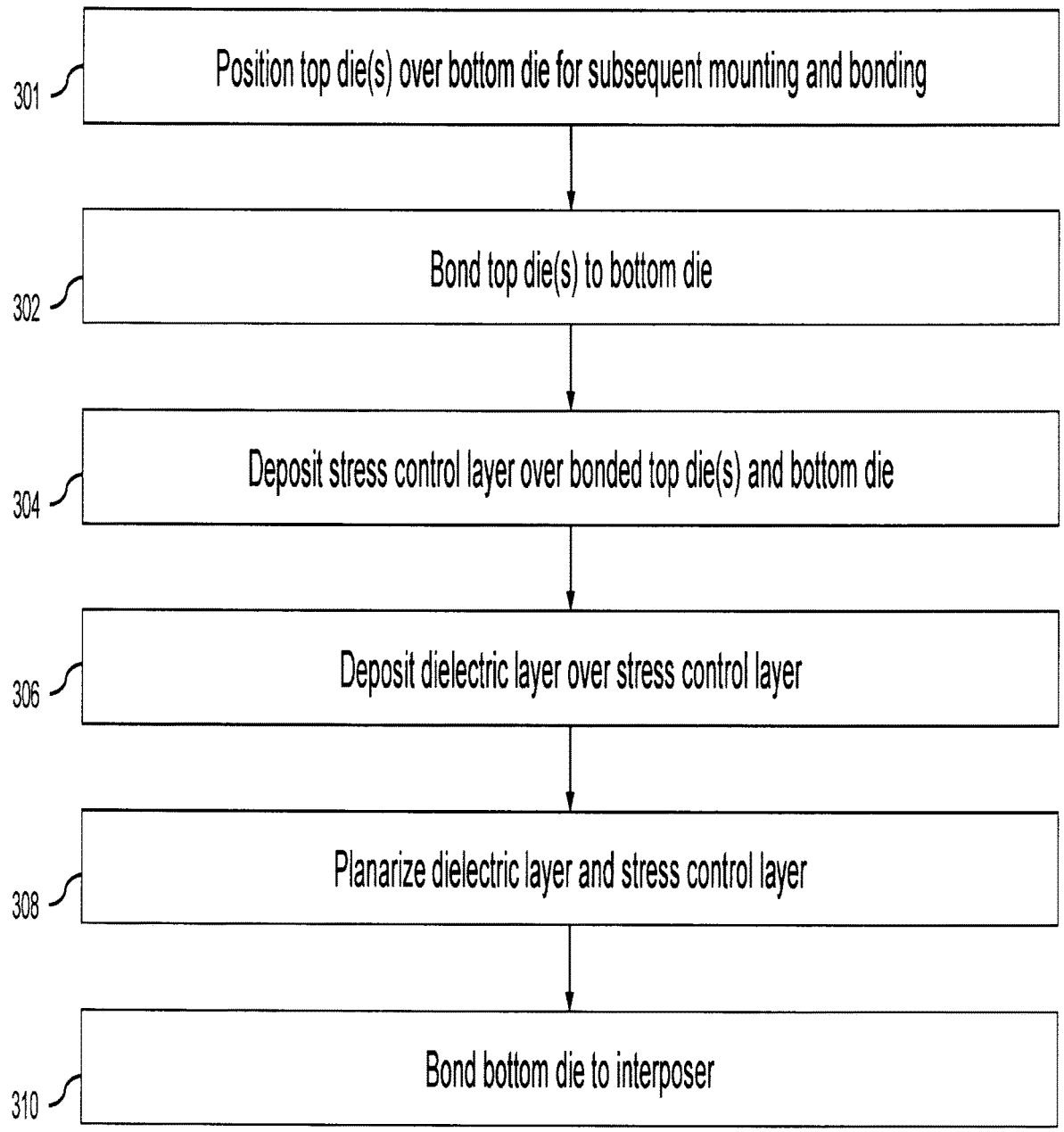
FIG. 3 is a flow chart including operations of the method of FIGS. 2A-2G.

Referring to FIGS. 2A and 3, in operation 301, one or more top dies 110, such as a first top die 110A and a second top die 110B, may be positioned over a bottom die 100, which may be disposed on a carrier 50. The carrier 50 may be a planar substrate configured to provide mechanical support to the bottom die 100. The carrier 50 may be formed of a suitable substrate material, such as glass material, a ceramic material (e.g., a sapphire substrate), a semiconductor material (e.g., a silicon substrate), or the like. Other suitable materials for the carrier 50 are within the contemplated scope of disclosure. In some embodiments, the carrier 50 may be formed of an optically transparent material.

The bottom die 100 and the top dies 110 may include at least one system-on-chip (SoC) semiconductor die. For example, the bottom die 100 may be an SoC die. An SoC die may include, for example, an application processor die, a central processing unit die, and/or a graphic processing unit die. In some embodiments, the top dies 110 may include at least one memory die, such as a high bandwidth memory (HBM) die. In some embodiments, an HBM die or a semiconductor device may include a vertical stack of interconnected memory dies. In some embodiments, the top dies 110 may be homogeneous, meaning that all of the top dies 110 may be of the same type of die or may be different types of dies. Further, although two top dies 110 are shown mounted over the bottom die 100, it will be understood that in various embodiments more than two top dies 110 may be mounted on the bottom die 100.

The bottom die 100 may be a semiconductor die that includes a first semiconductor layer 102 and a first RDL 104. The top dies 110 may be semiconductor dies that each include a second semiconductor layer 112 and a second RDL 114. The first semiconductor layer 102 and the second semiconductor layer 112 may comprise a semiconductor material such as silicon, a compound semiconductor material, or the like, and active and passive components (collectively referred to as components), such as transistors, capacitors, inductors, etc. The second RDLs 114 may be configured to electrically interconnect the active and passive components of the second semiconductor layers 112 with the active and passive components of the first semiconductor layer 102. The first semiconductor layer 102 may be relatively thin and/or may have a relatively high aspect ratio. For example, the first semiconductor layer 102 may have a thickness of less than 200 µm, such as less than 150 µm or less than 100 µm and/or may have an aspect ratio (e.g., a length L to width W ratio, see FIG. 2H) of greater than 1.75, such as greater than 2, or greater than 2.25. The footprint (e.g., area) of the bottom die 100 may be larger than a footprint of the top dies 110. For example, in some embodiments from 1 to 6 top dies 110 may be accommodated directly on the top surface of the first semiconductor layer 102 of the bottom die 100.

In some embodiments, a release layer 52 may be used to adhere the bottom die 100 to the carrier 50. The release layer 52 may include an adhesive material that may be subsequently treated to cause the adhesive material of the release layer 52 to lose its adhesive properties, such that the carrier 50 may be separated from the bottom die 100. In some embodiments, the adhesive material of the release layer 52 may lose its adhesive properties when subjected to treatment using an energy source, such as a thermal, optical (e.g., UV, laser, etc.) and/or sonic (e.g., ultrasonic) energy source. In one non-limiting example, the release layer 52 may include a light-to-heat conversion (LTHC) material that may selectively absorb optical radiation in certain wavelength range(s), such as ultraviolet radiation, causing the LTHC material to heat up and thereby lose adhesion. In other embodiments in which the carrier 50 is formed of an optically transparent material, the application of an optical energy source may cause the release layer 52 to lose its adhesive property. Alternatively, the release layer 52 may include an adhesive material, such as an acrylic pressure-sensitive adhesive material, that may decompose when subjected to an elevated temperature. Other suitable materials for the release layer 52 are within the contemplated scope of disclosure.

The first RDL 104 and the second RDL 114 may include metal features 106 (e.g., metal lines and vias) surrounded by a dielectric material 108 that may form an insulating matrix around the metal features 106. The dielectric material may be a dielectric polymer material, such as polyimide (PI), benzocyclobutene (BCB), polybenzobisoxazole (PBO), or the like. Other suitable dielectric materials are within the contemplated scope of disclosure.

The metal features 106 may be configured to route electrical signals to and from the transistors and/or other electrical active and passive components (collectively referred to as components) of the first semiconductor layer 102 and the second semiconductor layer 112. The metal features 106 may be formed of a suitable conductive material, such as Cu, Ni, W, Cu, Co, Mo, Ru, etc., including alloys and combinations of the same. In some embodiments, the metal features 106 may include a metallic barrier layer, such as a layer of Ti, TiN, TaN, or WN, contacting the dielectric material 108, and a metallic fill material, which may include an elemental metal (e.g., Cu, Ni, etc.) or an alloy or a combination thereof. Other suitable materials for the metal features 106 as well as the metallic barrier layer are within the contemplated scope of disclosure.

In one non-limiting example, the first RDL 104 and the second RDL 114 may be formed by sequentially depositing layers of the dielectric material 108. The layers of dielectric material 108 may be formed using a suitable deposition process, such as a spin coating and drying process. Other suitable deposition processes are within the contemplated scope of disclosure. Each of the layers of dielectric material 108 may be lithographically patterned and etched to form open regions (e.g., trenches and/or via openings), and a metallization process may then be used to fill the open regions and form the metal features 106 (e.g., metal lines and vias) within each successive layer of dielectric material 108.

For example, the metal features 106 may be formed using any suitable deposition process. For example, suitable deposition processes may include physical vapor deposition (PVD), sputtering, chemical vapor deposition (CVD), atomic layer deposition (ALD), plasma-enhanced chemical vapor deposition (PECVD), electrochemical deposition (e.g., electroplating), combinations thereof, or the like.

Figure 2B:
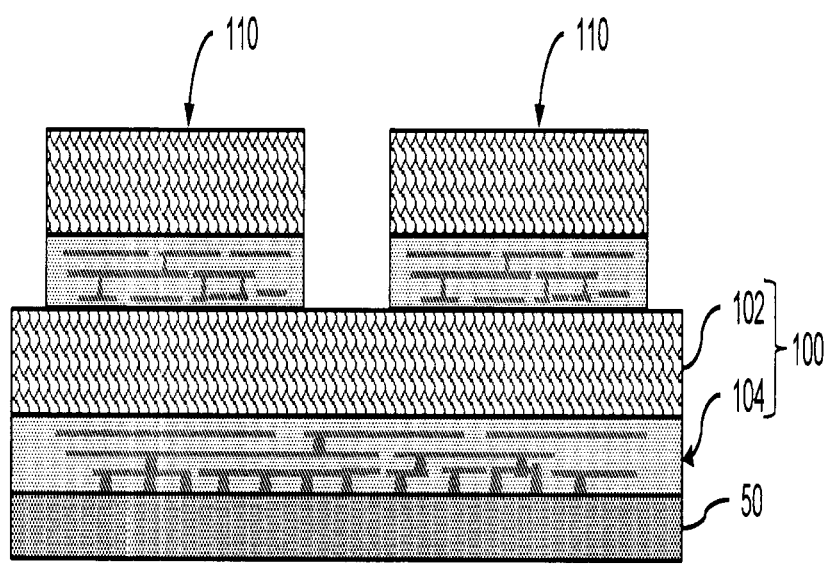

Referring to FIGS. 2B and 3, in operation 302 the top dies 110 may be bonded to the bottom die 100. For example, the top dies 110 and the bottom die 100 may be fusion bonded and/or hybrid bonded by applying heat and/or pressure thereto. The bonding may fuse metal contacts of the second RDLs 114 to metal contacts of the first semiconductor layer 102. However, the present disclosure is not limited to any particular die bonding method. As shown in FIG. 2B, the top dies 110 and the bottom die 100 may have a face-to-back bonding configuration and may include one or more though silicon via (TSV) structures (not shown) formed in the first semiconductor layer 102 to electrically connect control elements (e.g., transistors) of the first semiconductor layer to control elements of one or both of the second semiconductor layers 112. However, in other embodiments, the top dies 110 and the bottom die 100 may have a face-to-face bonding configuration. In other words, the present disclosure is not limited to any particular orientation of the top dies 110 with respect to the bottom die 100.

Figure 2C:
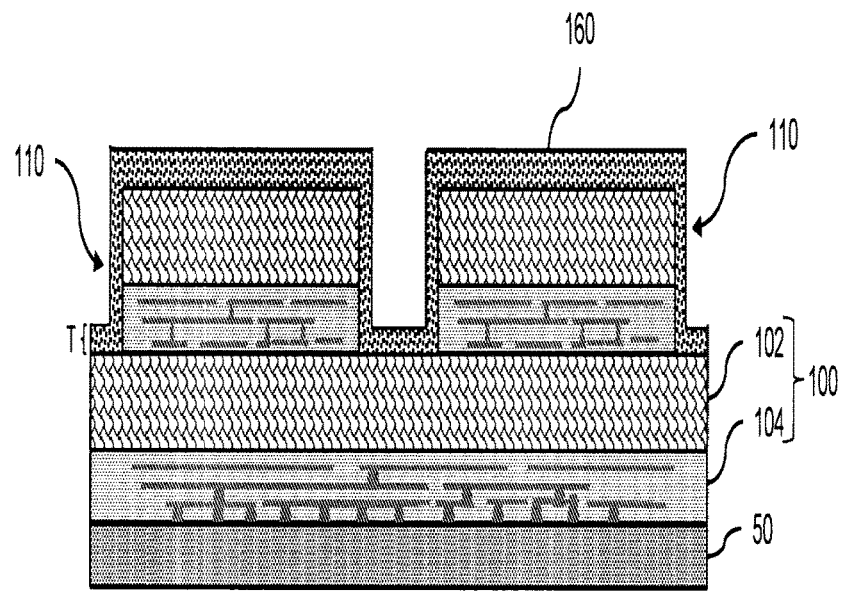

Referring to FIGS. 2C and 3, in operation 304 a stress control (SC) layer 160 may be deposited on the structure formed in FIG. 2B. In particular, the SC layer 160 may be deposited on top and side surfaces of the top dies 110 and on exposed portions of the top surface of the first semiconductor layer 102.

The SC layer 160 may be configured to reduce and/or prevent warpage of the bottom die 100. In particular, the SC layer 160 may be configured such that the bottom die 100 has a planar configuration during high-temperature bonding to other components such as an interposer, as discussed below with respect to FIG. 2G. For example, at room temperature, the SC layer 160 may be configured to apply a selected amount of a positive (tensile) residual stress or a negative (compressive) residual stress to the to surface of the first semiconductor layer 102, to counteract a corresponding tensile or compressive residual stress applied to the bottom surface of the first semiconductor layer 102 by the first RDL 104.

For example, in instances in which the first RDL 104 generates a compressive residual stress at the bottom surface of the first semiconductor layer 102, the SC layer 160 may generate an opposing compressive residual stress at the top surface of the first semiconductor layer 102. In the alternative, in instances in which the first RDL 104 generates a tensile residual stress at the bottom surface of the first semiconductor layer 102, the SC layer 160 may generate an opposing tensile residual stress at the top surface of the first semiconductor layer 102.

In some embodiments, the CTE of the first RDL 104 may exceed the CTE of the SC layer 160. In such embodiments, at elevated temperatures, such as at bonding temperatures, the higher CTE of the first RDL 104 may result in an increase in the compressive stress generated by the first RDL 104 relative to the compressive stress generated by the SC layer 160. As such, the residual stress generated by the SC layer 160 may be tuned to account for the higher CTE of the first RDL 104. For example, the SC layer 160 may be configured to generate a compressive stress at room temperature that is higher than a compressive stress generated by the first RDL 104 at room temperature. In some embodiments, this residual stress imbalance may result in the top surface of the first semiconductor layer 102 being slightly concave, at room temperature. However, in other embodiments, the first semiconductor layer 102 may remain in a planar configuration. During heating, the higher CTE of the first RDL 104 may increase the compressive stress generated by the first RDL 104 relative to the SC layer 160. As such, the residual stress generated by the SC layer 160 may be tuned, such that the residual stresses generated by the first RDL 104 and the SC layer 160 are the same or approximately the same at higher temperatures, thereby preventing warping of the first semiconductor layer 102.

In other embodiments, the first RDL 104 may generate tensile residual stress and the SC layer 160 may be configured to generate a corresponding tensile residual stress. In some embodiments, the tensile residual stress generated by the SC layer 160 may exceed the tensile residual stress generated by the first RDL 104, such that the top surface of the first semiconductor layer 102 may be slightly convex, at room temperature. At higher temperatures, the tensile stresses may be approximately the same, thereby preventing warping of the first semiconductor layer 102.

Accordingly, the SC layer 160 may be configured to planarize (e.g., reduce and/or prevent warpage of the first semiconductor layer 102 at higher temperatures, such as during high-temperature bonding operations.

The SC layer 160 may comprise a material that can apply compressive or tensile residual stress to the first semiconductor layer 102. For example, the SC layer 160 may comprise silicon oxide ($SiO_x$), silicon nitride ($SiN_x$) e.g., ($Si_3N_4$), silicon oxynitride ($SiO_xN_y$), e.g., ($Si_3N_4$), silicon-germanium ($Si_{1-x}Ge_x$), tungsten (W), silicon carbide (SiC), or the like. In some embodiments, the SC layer 160 may comprise $sSiN_x$, $SiO_xN_y$, $Si_{1-x}Ge_x$, W, or SiC, and a dielectric layer disposed thereon may comprise $SiO_x$. However, other materials are contemplated within the scope of the present disclosure.

In some embodiments, the SC layer 160 may be configured to generate a tensile stress of greater than 100 MPa, such as a tensile stress ranging from 100 MPa to 2000 MPa, from 150 MPa to 1000 MPa, from 250 MPa to 750 MPa, or from 200 MPa to 400 MPa. In other embodiments, the SC layer 160 may be configured to generate a compressive stress of greater than −100 MPa, such as a compressive stress ranging from −100 MPa to −2000 MPa, from −150 MPa to −1000 MPa, from −250 MPa to −750 MPa, or from −200 MPa to −400 MPa. The above residual stresses may be generated at room temperature (e.g., 25° C.).

In embodiments where the SC layer 160 comprises $SiO_x$, the $SiO_x$ deposition parameters may be controlled such that the SC layer 160 produces a compressive stress ranging from −300 MPa to −50 MPa. In embodiments where the SC layer 160 comprises $SiN_x$, the $SiN_x$ deposition parameters may be controlled such that the SC layer 160 produces a tensile stress ranging from about 200 MPa to about 400 MPa. In embodiments where the SC layer 160 comprises $SiO_xN_y$, the $SiO_xN_y$ deposition parameters may be controlled such that the SC layer 160 produces a residual stress ranging from about 200 MPa to about −200 MPa. The above residual stresses may be generated at room temperature (e.g., 25° C.).

In some embodiments, a compressive SC layer 160 comprising silicon oxide may have a refractive index ranging from about 1.47 to about 1.50. In some embodiments, a tensile SC layer 160 comprising silicon nitride may have a refractive index ranging from about 1.9 to about 2.1. In some embodiments, a tensile SC layer 160 comprising silicon oxynitride may have a refractive index ranging from about 1.5 to about 1.65. The refractive index of the SC layer 160 may indicate compositional information thereof, such as a Si:N ratio or an Si:O ratio.

The SC layer 160 may be deposited using any suitable deposition method. For example, the SC layer 160 may be formed by physical vapor deposition (PVD), sputtering, chemical vapor deposition (CVD), atomic layer deposition (ALD), evaporation, spin casting, or the like. Preferably, the SC layer 160 may be deposited by a chemical vapor deposition (CVD) process, such as atmospheric chemical vapor deposition (ACVD), low-pressure chemical vapor deposition (LPCVD), or plasma-enhanced chemical vapor deposition (PECVD).

The residual stress generated by the SC layer 160 may be controlled by controlling CVD processing parameters and/or materials. For example, residual stress may be affected by lattice mismatch between deposited layers, deposition thickness, deposition rate, and/or deposition temperature. Deposition temperature may be of particular concern when a deposited material and an underlying layer have different CTEs, which higher CTE differences resulting in higher amounts of residual stress.

LPCVD may be suitable for depositing various doped and un-doped forms of silicon oxide (e.g., phosphosilicate glass (PSG), borophosphosilicate glass (BPSG), low-temperature oxides, $SiN_x$, and $SiO_xN_y$. Residual stresses in LPCVD thin-film material layers may be large in magnitude, may vary over large ranges, and may be compressive or tensile. Major process parameters that may be varied to modify the materials properties of LPCVD deposited layers include deposition temperature, material chemistry, and gas pressure.

PECVD may be useful when depositing materials on temperature-sensitive underlying substrates/layers. Residual stresses in PECVD thin-film material layers can be large in magnitude, can vary over large ranges, and may be compressive or tensile. Major process parameters that may be varied to modify the materials properties of PECVD deposited layers include deposition temperature, plasma energy, and gas pressure.

Figure 7:
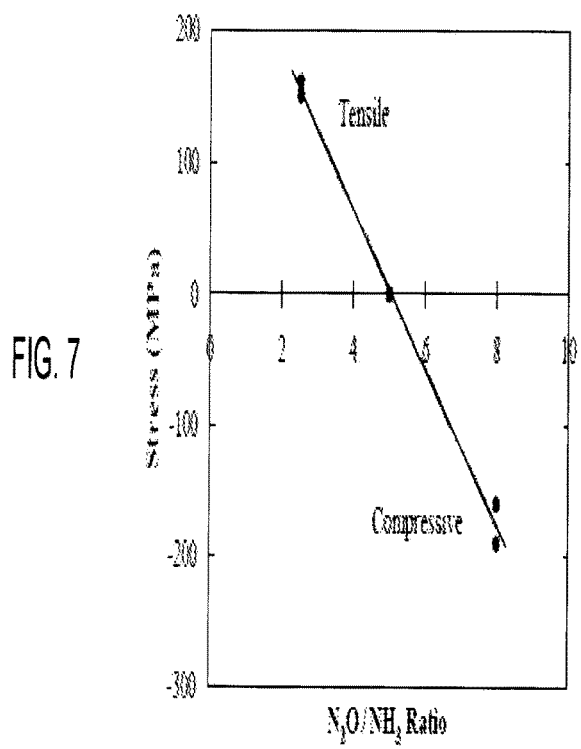
FIG. 7 is a graph showing residual stress variation in $SiO_yN_x$ films deposited at 250° C. with different $N_2O/NH_3$ gas flow ratios.

FIG. 7 is a graph showing residual stress variation in $SiO_yN_x$ films deposited at 250° C. with different $N_2O/NH_3$ gas flow ratios. As shown in FIG. 7, tensile stress may be generated in the SC layer 160 in instances in which the SC layer 160 is formed at lower $N_2O/NH_3$ gas flow ratios. In contrast, compressive stress may be generated in the SC layer 160 in instances in which the SC layer 160 is formed at higher $N_2O/NH_3$ gas flow ratios. Thus, SC layers 160 may be formed to provide varying magnitude of compressive or tensile stress. The amount of compressive or tensile stress provided by the formed SC layer 160 may compensate for or mitigate against the concave or convex configuration of the semiconductor layer 102 that results from the residual stress related to the materials used therein.

The residual stress generated by the SC layer 160 may also be controlled by controlling a thickness of the SC layer 160. For example, the SC layer 160 be deposited at a thickness T ranging from 100 angstroms to 100,000 angstroms, such as from 750 angstroms to 50,000 angstroms, from 1000 angstroms to 20,000 angstroms, from 2000 angstroms to 15,000 angstroms, or from 5000 angstroms to 10,000 angstroms.

Figure 2D:
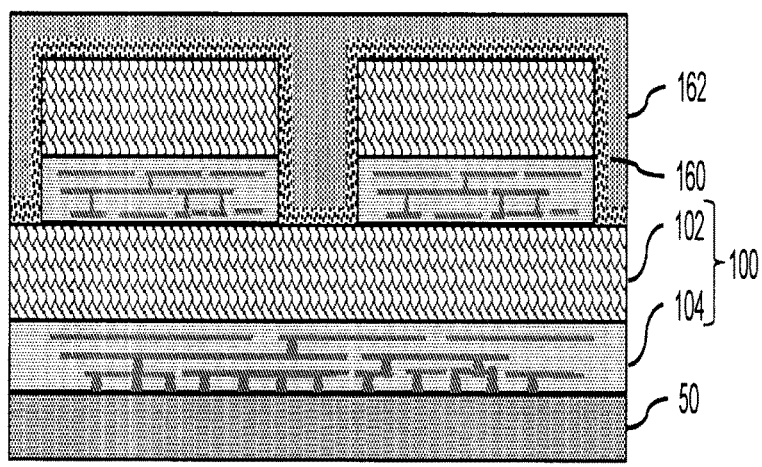

Referring to FIGS. 2D and 3, in operation 306 a dielectric layer 162 may be deposited on the SC layer 160 using a deposition as described above with respect to the SC layer 160. The dielectric layer 162 may comprise an oxide material such as silicon oxide ($SiO_x$) or the like, or a high-k dielectric material such as silicon nitride ($SiN_4$), hafnium oxide ($HfO_2$), hafnium silicon oxide (HfSiO), hafnium tantalum oxide (HfTaO), hafnium titanium oxide (HfTiO), hafnium zirconium oxide ($Hf_{0.5}Zr_{0.5}O_2$), tantalum oxide ($Ta_2O_5$), aluminum oxide ($Al_2O_3$), hafnium dioxide-alumina ($HfO_2$—$Al_2O_3$), zirconium oxide ($ZrO_2$), or the like. Other suitable dielectric materials may also be within the contemplated scope of disclosure.

The dielectric layer 162 may be used to fill gaps between the top dies 110. However, in some embodiments the gaps between the top dies 110 may be small enough to be completely filled by the SC layer 160 and the dielectric layer 162 may be omitted. In some embodiments, the dielectric layer 162 may be used to adjust the residual stress generated by the SC layer 160. For example, a residual stress generated by the dielectric layer 162 to the SC layer 160 may be used to increase or decrease a residual stress applied to the first semiconductor layer 102 by the SC layer 160. In various embodiments, the SC layer 160 and the dielectric layer 162 may generate different residual stresses and/or may be formed of different materials. In various embodiments, at temperatures ranging from 220° C. to 250° C., an amount of residual stress applied to the first semiconductor layer 102 by the SC layer 160 is within +/−10%, such as within +/−5%, of an amount of residual stress applied to the first semiconductor layer 102 by the first RDL 104.

Figure 2E:
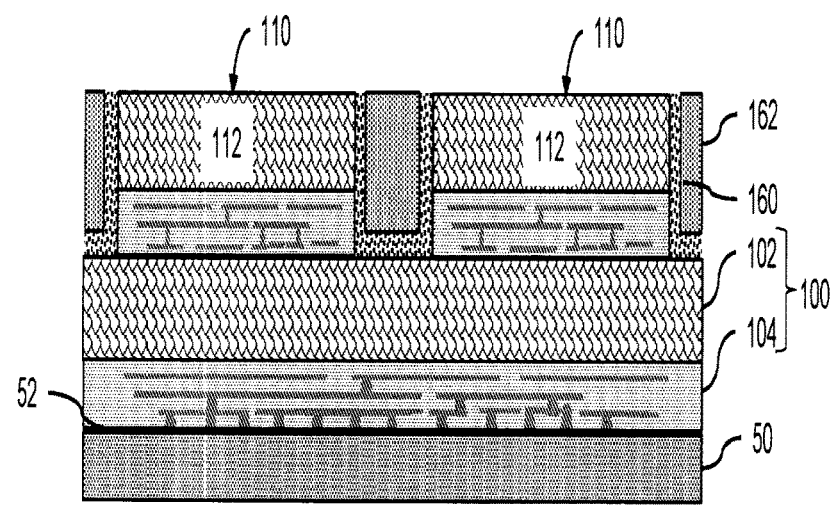

Referring to FIGS. 2E and 3, in operation 308 the structure of FIG. 2D may be planarized using any suitable planarization process. For example, the planarization process may include chemical-mechanical planarization (CMP) of the like. However, the present disclosure is not limited to any particular planarization process.

Figure 2F:
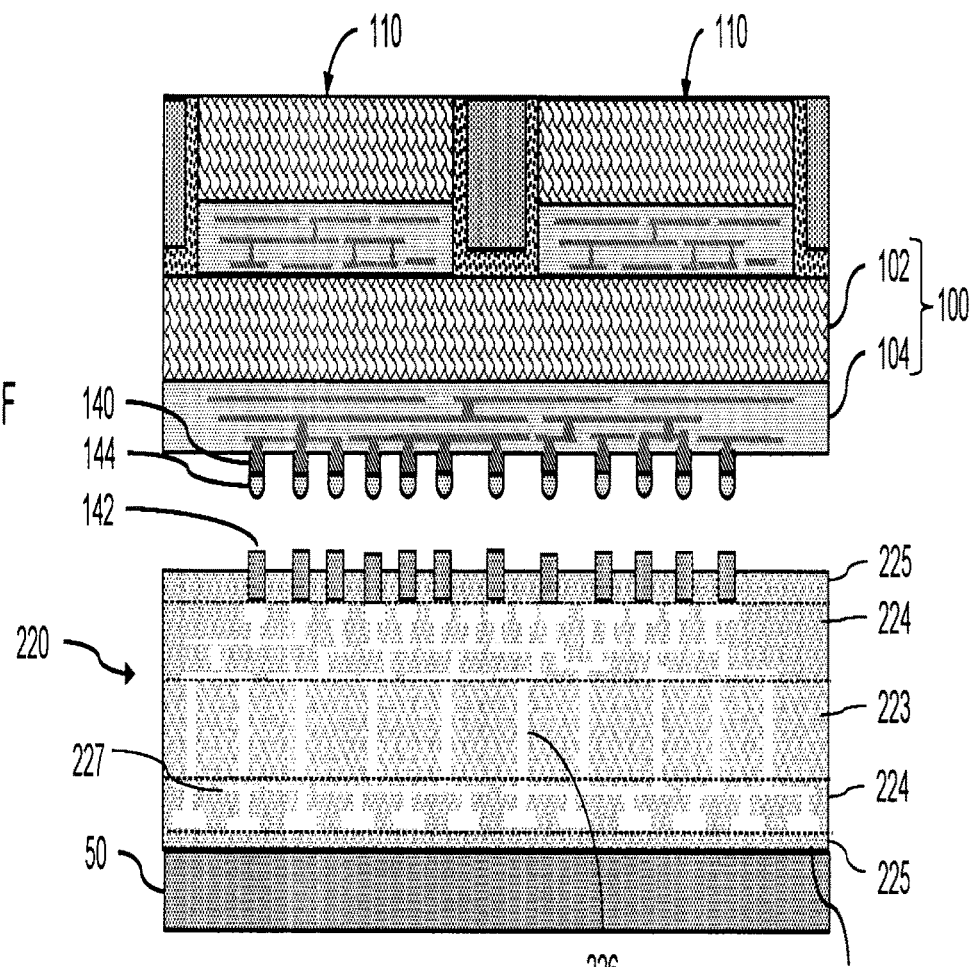

Referring to FIGS. 2E, 2F, and 3, in operation 310 the bottom die 100 may be bonded to an interposer 220. In particular, the structure of FIG. 2E may be removed from the carrier 50. For example, the release layer 52 may be subjected to a treatment that causes the first release layer 52 to lose its adhesive properties. This may enable the carrier 50 to be separated from the bottom die 100. For example, the release layer 52 may include a light-to-heat conversion (LTHC) material that may be irradiated by optical radiation in a specified wavelength range, such as ultraviolet radiation, causing the LTHC material to heat up and thereby lose adhesion. The release layer 52 may optionally be irradiated through the carrier 50 in embodiments in which the carrier 50 is composed of an optically-transparent material. Alternatively, the release layer 52 may include a thermally-decomposable adhesive material. The exemplary intermediate structure may be subjected to a thermal anneal process at a debonding temperature sufficient to cause the release layer 52 to decompose and thereby enable the carrier 50 to be detached.

After removal of the carrier 50, first bonding structures 140 may be formed on the RDL 104, and solder balls 144 may be formed on the first bonding structures 140. The first bonding structures 140 may include metal pillars or micro-bumps formed of one or more layers of a conductive metal, such as copper or a copper-containing alloy. In some embodiments, the first bonding structures 140 may include Cu—Ni—Cu metal stacks. Other suitable materials and/or configurations for the first bonding structures 140 are within the contemplated scope of disclosure. Solder balls 144 may be attached to the first bonding structures 140. The solder balls 144 may include a low melting point metal or metal alloy. For example, the solder balls 144 may comprise tin, a tin alloy, lead, a lead alloy, or the like.

The bottom die 100 may be positioned over a package substrate, such as an interposer 220 for example, using a pick-and-place method or the like, such that the first bonding structures 140 are aligned with second bonding structures 142 formed on the interposer 220. The second bonding structures 142 may be micro-bumps or pillars comprising copper or a copper-containing alloy.

In various embodiments, the interposer 220 may be attached to a carrier 50 by a release layer 52. The interposer 220 may include metal features 227 (e.g., metal lines, vias, bonding regions, etc.) that extend within the interposer 220. In some embodiments, the interposer 220 may be configured to be mounted to a supporting substrate, such as a printed circuit board (PCB). Electrical connections between the supporting substrate (e.g., a PCB) and the interposer 220 may be made via the redistribution structures 224 within the interposer 220.

In some embodiments, the interposer 220 may include a multi-layer structure including a substrate 223, such as a silicon substrate, at least one redistribution layer 224, and at least one outer coating layer 225. For example, the interposer 220 may include a pair of redistribution layers 224 located above and below the substrate 223. The substrate 223 may be a plate-like member composed of a suitable material other than silicon, such as an epoxy resin, glass, and/or ceramic material. The substrate 223 may include a plurality of conductive via structures 226 extending through the substrate 223. The redistribution layers 224 may include metal features 227, such as metal lines, vias, and bonding regions, embedded in a dielectric material matrix. In some embodiments, the dielectric material matrix may include multiple layers of a dielectric material, such as a photosensitive epoxy material. Each layer of dielectric material may be lithographically patterned to form open regions (e.g., trenches and via openings) within the respective layers of dielectric material. A metallization process may be used to fill the open regions with a suitable conductive material, such as copper or a copper-alloy, within each layer of dielectric material to form the metal features 227 embedded within the dielectric material matrix.

The outer coating layers 225 may be formed of a dielectric material such as silicon oxide or the like. In some embodiments, the outer coating layers 225 may optionally include a layer of solder resist material formed over the respective redistribution layers 224. Each of the layers of solder resist material may provide a protective coating for the interposer 220 and the underlying metal features 227. An outer coating layer 225 formed of solder resist material may also be referred to as a "solder mask." Other suitable configurations for the interposer 220 are within the contemplated scope of disclosure.

Figure 2G:
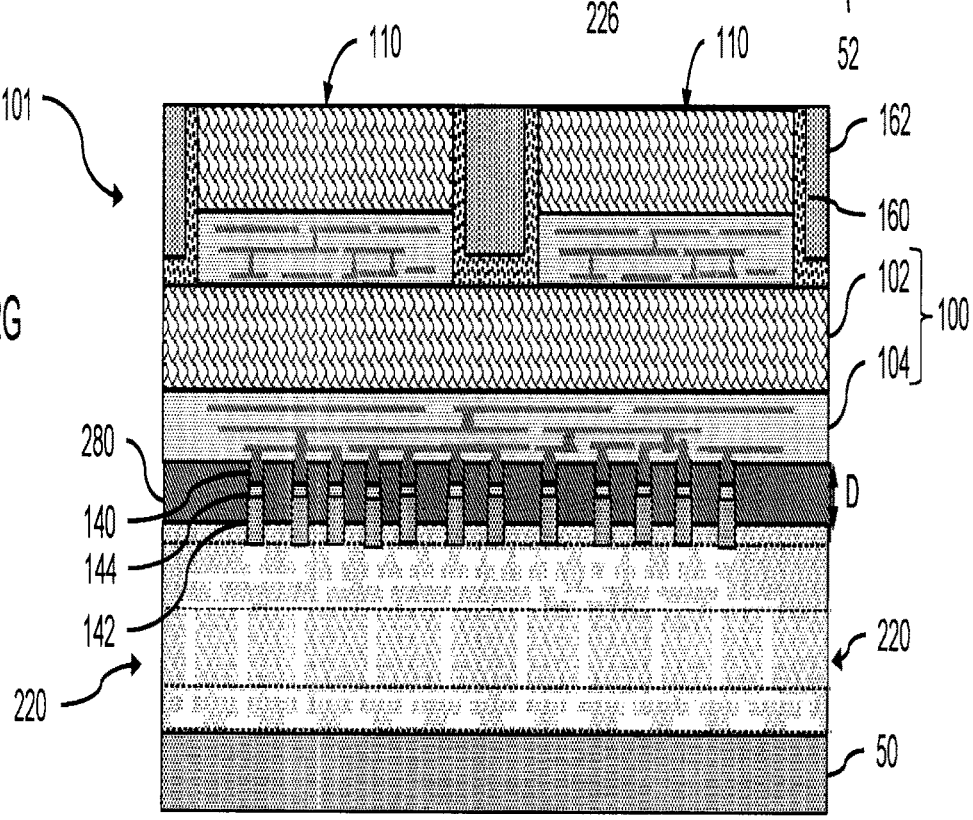

Referring to FIGS. 2G and 2H, the first bonding structures 140 and the second bonding structures 142 may be bonded together using a high temperature reflow process, such as a solder reflow bonding process, to form a semiconductor device 101 or package. In particular, the semiconductor device 101 may be heated to a solder reflow temperature to reflow the solder balls 144 and bond the first bonding structures 140 and the second bonding structures 142. For example, the bonding process may have bonding temperatures ranging from 200° C. to 300° C., such as from 220° C. to 250° C. when reflowing tin-based solders.

During the bonding process, the SC layer 160 may be configured to generate a residual stress sufficient to the first semiconductor layer 102 to assume or remain in a planar configuration, such that the first bonding structures 140 are disposed close enough to the second bonding structures 142 for bonding to occur. For example, the SC layer 160 may be configured such that a distance D, taken in a vertical direction anywhere between the top surface of the interposer 220 and the bottom surface of the first RDL 104, varies by less than about 3.0 microns, such as by less than 2.5 microns, less than 2.0 microns, less than 1.5 microns, less than 1 micron, or less than 0.5 microns.

In some embodiments, an underfill layer 280 may be injected between the interposer 220 and the first RDL 104. The underfill layer 280 may include any underfill material known in the art. For example, the underfill layer 280 may be composed of an epoxy-based material, which may include a composite of resin and filler materials. Other suitable materials for the first underfill layer 280 are within the contemplated scope of disclosure. Any known underfill material application method may be used to apply the first underfill layer 280.

Figure 4:
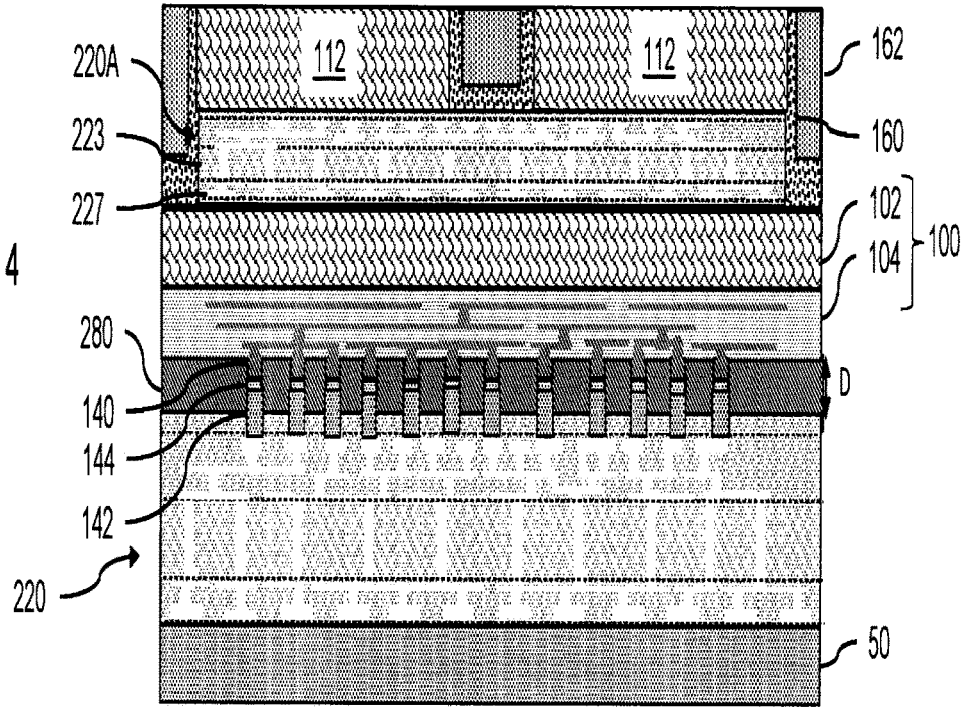
FIG. 4 is a vertical cross-section view of an alternative semiconductor device, according to various embodiments of the present disclosure.

FIG. 4 is a vertical cross-sectional view of a semiconductor device 401, according to various embodiments of the present disclosure. The semiconductor device 401 may be similar to the semiconductor device 101 of FIGS. 2G and 2H. As such, only the differences therebetween will be discussed in detail.

Referring to FIG. 4, the semiconductor device 401 may include top semiconductor dies 112 bonded to a top surface of a top interposer 220A using any suitable bonding method and/or bonding configuration. For example, front or back sides of the top semiconductor dies 112 may be fusion bonded or hybrid bonded to the top interposer 220A, as described above with respect to FIG. 2B. The bottom die 100 may be bonded to a bottom surface of the top interposer 220A. In some embodiments, the top interposer 220A may be similar to the interposer 220. For example, the top interposer 220A may include a silicon or polymer substrate 223 and metal features 227, as described above with respect to the interposer 220. The top interposer 220A may be configured to interconnect components of the top semiconductor dies 112 and components of the first semiconductor layer 102 of the bottom die 100. The top interposer 220A may also operate to reduce and/or prevent warpage of the first semiconductor layer 102 and may operate in conjunction with the SC layer 160 with respect to planarization of the first semiconductor layer 102.

Figure 5:
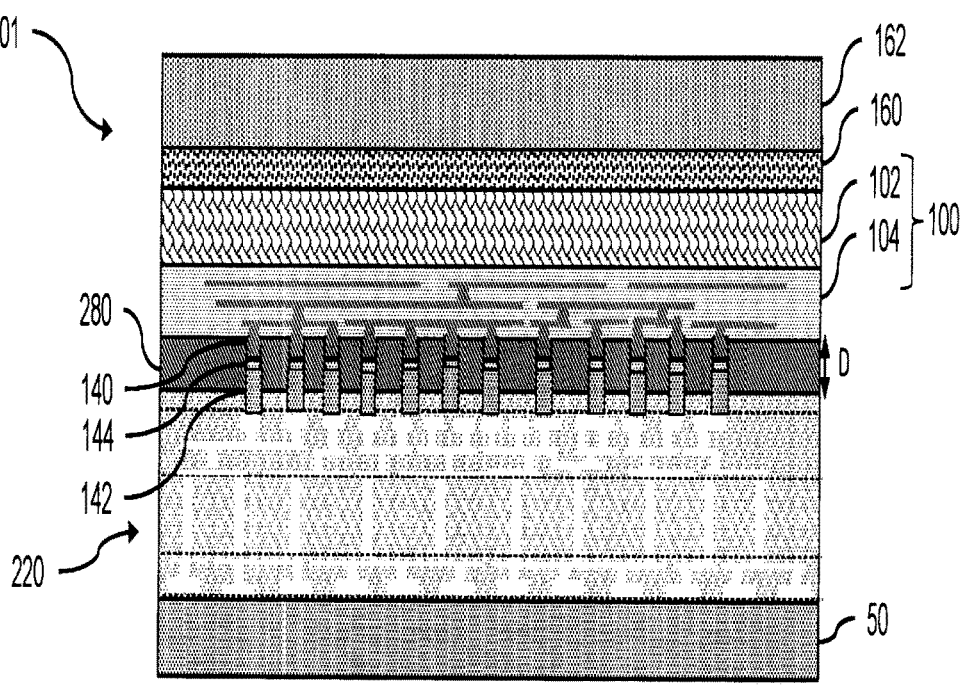
FIG. 5 is a vertical cross-section view an alternative semiconductor device, according to various embodiments of the present disclosure.

FIG. 5 is a vertical cross-sectional view of a semiconductor device 501, according to various embodiments of the present disclosure. The semiconductor device 501 may be similar to the semiconductor device 101 of FIGS. 2G and 2H. As such, only the differences therebetween will be discussed in detail.

Referring to FIG. 5, the semiconductor device 501 may include the bottom die 100 and may omit top dies 110. In particular, the SC layer 160 may completely cover the top surface of the first semiconductor layer 102. In some embodiments, the SC layer 160 may be configured to apply a compressive stress of at least −100 MPa to the top surface of the first semiconductor layer at room temperature (e.g., at about 20° C.). In the alternative, the SC layer 160 may be configured to apply a tensile stress of at least 100 MPa to the top surface of the first semiconductor layer 102 at room temperature.

A dielectric layer 162 may be disposed on the top surface of the SC layer 160. For example, the dielectric layer 162 may be used to tune the residual stress generated by the SC layer 160, if desired. However, in other embodiments, the dielectric layer 162 may be omitted.

Figure 6:
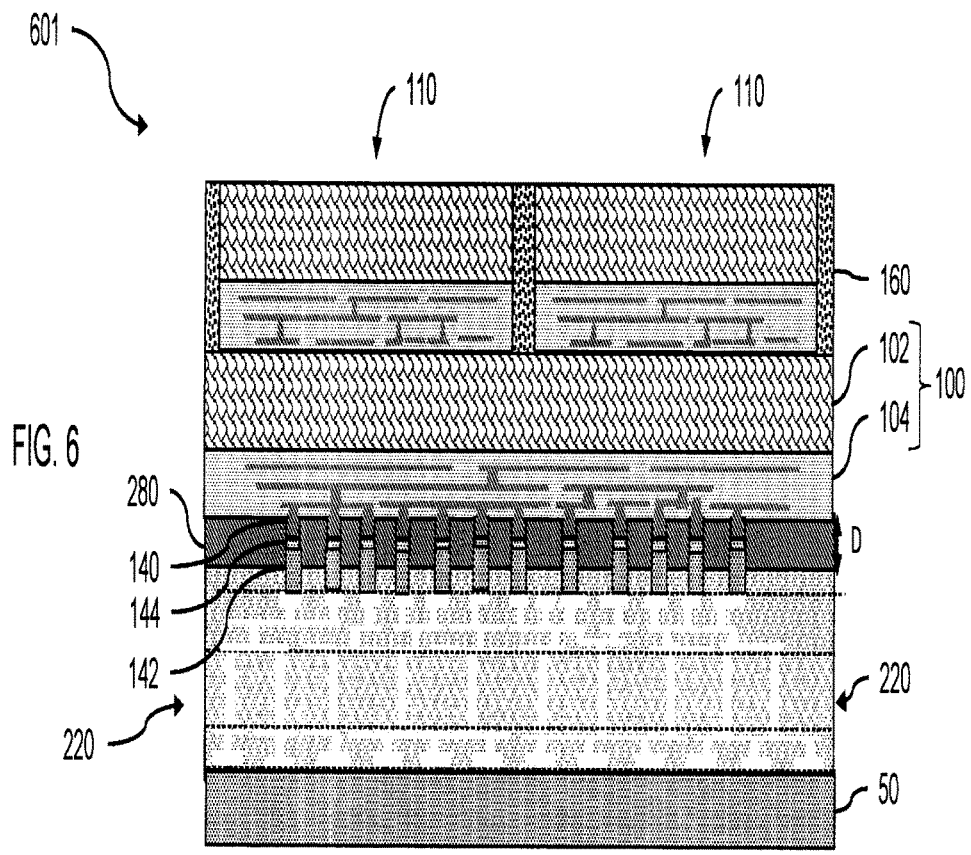
FIG. 6 is a vertical cross-section view of an alternative semiconductor device, according to various embodiments of the present disclosure.

FIG. 6 is a vertical cross-sectional view of a semiconductor device 601, according to various embodiments of the present disclosure. The semiconductor device 601 may be similar to the semiconductor device 101 of FIGS. 2G and 2H. As such, only the differences therebetween will be discussed in detail.

Referring to FIG. 6, the top dies 110 of the semiconductor device 601 may be disposed in closer proximity to each other than the top dies 110 of the semiconductor device 101. As such, the SC layer 160 may completely fill the space between the top dies 110. As such, the dielectric layer 162 may be omitted.

Referring to all drawings and according to various embodiments of the present disclosure, provided is a semiconductor device 101 comprising: a bottom die 100 comprising: a first semiconductor layer 102; and a first redistribution layer (RDL) 104 disposed on a bottom surface of the first semiconductor layer 102 and electrically interconnecting components the first semiconductor layer 102; a top die 110 disposed on a top surface of the first semiconductor layer 102, the top die 110 comprising: a second semiconductor layer 112; and a second RDL 114 disposed on the top surface of the first semiconductor layer and electrically interconnecting components of the second semiconductor layer 112; a stress control (SC) layer 160 disposed on the top surface of the first semiconductor layer 102 and side surfaces of the top die 110; and a dielectric layer 162 disposed on the SC layer 160, wherein the SC layer 160 is configured to apply a compressive stress of at least −100 MPa to the top surface of the first semiconductor layer 102, or the SC layer 160 is configured to apply a tensile stress of at least 100 MPa to the top surface of the first semiconductor layer 102.

In various embodiments, the first semiconductor layer 102 has a thickness of 100 μm or less and a length to width aspect ratio of two or more. It is believed that relatively small thicknesses and/or high aspect rations may reduce the resistance of the first semiconductor layer 102 to warping. In various embodiments, the semiconductor device 101 may further comprise an interposer 220 bonded to a bottom surface of the first RDL 104. The SC layer 160 may be configured to planarize the first semiconductor layer 102 during bonding of the first RDL 104 to the interposer 220, such that a distance between the first RDL 104 and the interposer 220, taken in a vertical direction perpendicular to the top surface of the first semiconductor layer 102, varies by 2 μm or less, or 1 μm or less.

In some embodiments, the SC layer 160 has a thickness ranging from about 1000 angstroms to about 20,000 angstroms. In various embodiments, the SC layer 160 and the dielectric layer 162 generate different amounts of residual stress. In some embodiments, the dielectric layer 162 comprises silicon oxide ($SiO_x$); and the SC layer 160 comprises silicon nitride ($SiN_x$), silicon oxynitride ($SiO_xN_y$), silicon-germanium ($Si_{1-x}Ge_x$), tungsten (W), or silicon carbide (SiC).

In various embodiments, the SC layer 160 is configured to apply a compressive stress of at least −200 MPa to the top surface of the first semiconductor layer; and the first RDL 104 is configured to apply a compressive stress to the bottom surface of the first semiconductor layer 102. The SC layer 160 may be formed by a CVD process. In various embodiments, at temperatures ranging from 220° C. to 250° C., an amount of residual stress applied to the first semiconductor layer 102 by the SC layer 160 is within +/−10% of an amount of residual stress applied to the first semiconductor layer 102 by the first RDL 104 and/or by the dielectric layer 162.

Referring to all drawings and according to various embodiments of the present disclosure, provided is a semiconductor device 501 comprising a bottom die 100 comprising: a first semiconductor layer 102; and a first redistribution layer (RDL) 104 disposed on a bottom surface of the first semiconductor layer 102 and electrically interconnecting components of the first semiconductor layer 102; a stress control (SC) layer 160 disposed on the top surface of the first semiconductor layer 102; and a dielectric layer 162 disposed on the SC layer 160; and an interposer 220 bonded to a bottom surface of the first RDL. The SC layer 160 may be configured to apply a compressive stress of at least −100 MPa to the top surface of the first semiconductor layer 102, or the SC layer 160 may be configured to apply a tensile stress of at least 100 MPa to the top surface of the first semiconductor layer 102.

In one embodiment, the first semiconductor layer 102 may have a thickness of 100 microns (μm) or less and a length to width aspect ratio of two or more. In one embodiment, the SC layer is 160 may be configured to planarize the first semiconductor layer 102 during bonding of the first RDL 104 to the interposer 220, such that a distance between the first RDL 104 and the interposer 220, taken in a vertical direction perpendicular to the top surface of the first semiconductor layer 102, varies by 2 μm or less. In one embodiment, the distance between the first RDL 104 and the interposer 220, taken in a vertical direction perpendicular to the top surface of the first semiconductor layer 102 varies by 1 μm or less. In one embodiment, the dielectric layer 162 comprises silicon oxide ($SiO_x$); and the SC layer 160 comprises silicon nitride ($SiN_x$), silicon oxynitride ($SiO_xN_y$), silicon-germanium ($Si_{1-x}Ge_x$), tungsten (W), or silicon carbide (SiC), and the SC layer has a thickness ranging from about 10 nanometers (nm) to about 20,000 nm. In one embodiment, the SC layer 160 may be configured to apply a compressive stress of at least −200 mega Pascals (MPa) to the top surface of the first semiconductor layer 102; and the first RDL 104 may be configured to apply a compressive stress to the bottom surface of the first semiconductor layer 102. In one embodiment, the SC layer 1600 may be configured to apply a tensile stress of at least 200 MPa to the top surface of the first semiconductor layer 102; and the first RDL 104 may be configured to apply a tensile stress to the bottom surface of the first semiconductor layer 102.

Referring to all drawings and according to various embodiments of the present disclosure, provided is a semiconductor device 401 comprising: a first semiconductor layer 102; and a first redistribution layer (RDL) 104 disposed on a bottom surface of the first semiconductor layer 102 and electrically interconnecting components the first semiconductor layer 102; a top interposer 220A disposed on a top surface of the first semiconductor layer 102, the top interposer 220A comprising a silicon substrate 223 and first metal features 227 that are electrically connected to components of the first semiconductor layer 102; second semiconductor layers 112 disposed on a top surface of the top interposer 220A, each second semiconductor layer 112 comprising components that are electrically connected to the first metal features 227; and a stress control (SC) layer 160 disposed on the top surface of the first semiconductor layer 102, the top surface of the top interposer 220A, and side surfaces of the second semiconductor layers 112 and the top interposer, wherein, the SC layer is configured to apply a compressive stress of at least −100 MPa to the top surface of the first semiconductor layer 102, or the SC layer 160 is configured to apply a tensile stress of at least 100 MPa to the top surface of the first semiconductor layer 102.

In one embodiment, the semiconductor device may also include a dielectric layer 162 disposed on the SC layer 160, wherein the dielectric layer 162 and the SC layer 160 generate different amounts of residual stress. In one embodiment, the first semiconductor layer 102 has a thickness of 100 microns or less and a length to width aspect ratio of two or more; and the SC layer 160 has a thickness ranging from about 1000 angstroms to about 20,000 angstroms. In one embodiment, the semiconductor device may also include a second interposer bonded to a bottom surface of the first RDL 104; wherein the SC layer 160 may be configured to planarize the first semiconductor layer 102 during bonding of the first RDL 104 to the second interposer 220, such that a distance between the first RDL 104 and the second interposer, taken in a vertical direction perpendicular to the top surface of the first semiconductor layer, varies by 2 μm or less.

According to another aspect of the present disclosure, a method of forming a semiconductor device may be provided. The method of forming a semiconductor device may include the steps of: bonding top dies 110 to a top surface of a bottom die 100; depositing a stress control (SC) layer 160 on top and side surfaces of the top dies 110 and on the top surface of the bottom die 100; depositing a dielectric layer 162 on the SC layer 160 to form an intermediate structure; planarizing the intermediate structure to expose top surfaces of the top dies 110; and reflow bonding an interposer 220 to a bottom surface of the bottom die 100, wherein at room temperature: the SC layer 160 is configured to apply a compressive stress of at least −100 mega Pascals (MPa) to the top surface of the bottom die; or the SC layer 160 is configured to apply a tensile stress of at least 100 MPa to the top surface of the bottom die.

In an embodiment, the dielectric layer 162 comprises silicon oxide (SiOx); and the SC layer 160 comprises silicon nitride (SiNx), silicon oxynitride (SiOxNy), silicon-germanium (Si1−xGex), tungsten (W), or silicon carbide (SiC), and the SC layer 160 has a thickness ranging from about 10 nanometers (nm) to about 20,000 nm. In an embodiment, the reflow bonding comprises heating at a bonding temperature ranging from 220° C. to 250° C.; the SC layer 160 is configured to planarize the bottom die 100 during the reflow bonding, such that a distance between the bonding pads 140 of the bottom die and bonding pads 142 of the interposer 220, taken in a vertical direction perpendicular to the top surface of the bottom die, varies by 2 μm or less. In various embodiments, the bonding top dies 110 to a top surface of a bottom die 100 comprises face-to-face bonding or face-to-back bonding of the top dies 110 to the bottom die 100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a bottom die comprising:
      a first semiconductor layer; and
      a first redistribution layer (RDL) disposed on a bottom surface of the first semiconductor layer and electrically interconnecting components of the first semiconductor layer;
   a top die disposed on a top surface of the first semiconductor layer, the top die comprising:
      a second semiconductor layer; and
      a second RDL disposed on the top surface of the first semiconductor layer and electrically interconnecting components of the second semiconductor layer;
   a stress control (SC) layer disposed on the top surface of the first semiconductor layer and side surfaces of the top die; and
   a dielectric layer disposed on the SC layer,
   wherein at room temperature,
      the SC layer is configured to apply a compressive stress of at least −100 mega Pascals (MPa) to the top surface of the first semiconductor layer, or
      the SC layer is configured to apply a tensile stress of at least 100 MPa to the top surface of the first semiconductor layer.

2. The semiconductor device of claim 1, wherein the first semiconductor layer has a thickness less than or equal to 100 microns (μm) and a length to width aspect ratio of two or more.

3. The semiconductor device of claim 2, further comprising an interposer bonded to a bottom surface of the first RDL,
   wherein the SC layer is configured to planarize the first semiconductor layer during bonding of the first RDL to the interposer, such that a distance between the first RDL and the interposer, taken in a vertical direction perpendicular to the top surface of the first semiconductor layer, varies by 2 μm or less.

4. The semiconductor device of claim 3, wherein the distance varies by 1 μm or less.

5. The semiconductor device of claim 1, wherein the SC layer has a thickness ranging from about 1000 angstroms to about 20,000 angstroms.

6. The semiconductor device of claim 1, wherein the SC layer and the dielectric layer generate different amounts of residual stress.

7. The semiconductor device of claim 1, wherein:
   the SC layer is configured to apply a tensile stress of at least 200 MPa to the top surface of the first semiconductor layer; and
   the first RDL is configured to apply a tensile stress to the bottom surface of the first semiconductor layer.

8. The semiconductor device of claim 1, wherein:
   the SC layer is configured to apply a compressive stress of at least −200 MPa to the top surface of the first semiconductor layer; and
   the first RDL is configured to apply a compressive stress to the bottom surface of the first semiconductor layer.

9. The semiconductor device of claim 1, wherein, at temperatures ranging from 220° C. to 250° C., an amount of residual stress applied to the first semiconductor layer by the SC layer is within +/−10% of an amount of residual stress applied to the first semiconductor layer by the first RDL.

10. A semiconductor device comprising:
    a bottom die comprising:
       a first semiconductor layer; and a first redistribution layer (RDL) disposed on a bottom surface of the first semiconductor layer and electrically interconnecting components the first semiconductor layer;

a stress control (SC) layer disposed on a top surface of the first semiconductor layer;

a dielectric layer disposed on the SC layer; and an interposer bonded to a bottom surface of the first RDL, wherein at room temperature, the SC layer is configured to apply a compressive stress of at least −100 mega Pascals (MPa) to the top surface of the first semiconductor layer; or the SC layer is configured to apply a tensile stress of at least 100 MPa to the top surface of the first semiconductor layer.

11. The semiconductor device of claim 10, wherein the first semiconductor layer has a thickness of 100 microns (μm) or less and a length to width aspect ratio of two or more.

12. The semiconductor device of claim 11, wherein the SC layer is configured to planarize the first semiconductor layer during bonding of the first RDL to the interposer, such that a distance between the first RDL and the interposer, taken in a vertical direction perpendicular to the top surface of the first semiconductor layer, varies by 2 μm or less.

13. The semiconductor device of claim 12, wherein the distance varies by 1 μm or less.

14. The semiconductor device of claim 10, wherein:

the dielectric layer comprises silicon oxide ($SiO_x$); and the SC layer comprises silicon nitride ($SiN_x$), silicon oxynitride ($SiO_xN_y$), silicon-germanium ($Si_{1-x}Ge_x$), tungsten (W), or silicon carbide (SiC), and the SC layer has a thickness ranging from about 10 nanometers (nm) to about 20,000 nm.

15. The semiconductor device of claim 10, wherein:

the SC layer is configured to apply a compressive stress of at least −200 mega Pascals (MPa) to the top surface of the first semiconductor layer; and the first RDL is configured to apply a compressive stress to the bottom surface of the first semiconductor layer.

16. The semiconductor device of claim 10, wherein:

the SC layer is configured to apply a tensile stress of at least 200 MPa to the top surface of the first semiconductor layer; and the first RDL is configured to apply a tensile stress to the bottom surface of the first semiconductor layer.

17. A method of forming a semiconductor device, comprising:

bonding top dies to a top surface of a bottom die;

depositing a stress control (SC) layer on top and side surfaces of the top dies and on the top surface of the bottom die;

depositing a dielectric layer on the SC layer to form an intermediate structure;

planarizing the intermediate structure to expose top surfaces of the top dies; and reflow bonding an interposer to a bottom surface of the bottom die, wherein at room temperature:

the SC layer is configured to apply a compressive stress of at least −100 mega Pascals (MPa) to the top surface of the bottom die; or the SC layer is configured to apply a tensile stress of at least 100 MPa to the top surface of the bottom die.

18. The method of claim 17, wherein:

the dielectric layer comprises silicon oxide ($SiO_x$); and the SC layer comprises silicon nitride ($SiN_x$), silicon oxynitride ($SiO_xN_y$), silicon-germanium ($Si_{1-x}Ge_x$), tungsten (W), or silicon carbide (SiC), and the SC layer has a thickness ranging from about 10 nanometers (nm) to about 20,000 nm.

19. The method of claim 18, wherein:

the reflow bonding comprises heating at a bonding temperature ranging from 220° C. to 250° C.; and the SC layer is configured to planarize the bottom die during the reflow bonding, such that a distance between the bonding pads of the bottom die and bonding pads of the interposer, taken in a vertical direction perpendicular to the top surface of the lower die, varies by 2 μm or less.

20. The method of claim 18, wherein the bonding top dies to a top surface of a bottom die comprises face-to-face bonding or face-to-back bonding of the top dies to the bottom die.

* * * * *